US012112994B2

United States Patent
Oehling et al.

(10) Patent No.: US 12,112,994 B2
(45) Date of Patent: Oct. 8, 2024

(54) POWER SEMICONDUCTOR MODULE HAVING A PRESSURE DEVICE ACTING ON A SWITCHING DEVICE

(71) Applicant: SEMIKRON DANFOSS ELEKTRONIK GMBH & CO. KG, Nuremberg (DE)

(72) Inventors: Stefan Oehling, Uttenreuth (DE); Matthias Hager, Langenzenn (DE); Verena Gulitsch, Neuhaus a.d. Pegnitz (DE); Harald Kobolla, Seukendorf (DE)

(73) Assignee: SEMIKRON DANFOSS ELEKTRONIK GMBH & CO. KG, Nuremberg (DE)

( * ) Notice: Subject to any disclaimer, the term of this patent is extended or adjusted under 35 U.S.C. 154(b) by 0 days.

(21) Appl. No.: 18/384,799

(22) Filed: Oct. 27, 2023

(65) Prior Publication Data
US 2024/0153844 A1    May 9, 2024

(30) Foreign Application Priority Data
Nov. 8, 2022   (DE) ............... 10 2022 129 449.8

(51) Int. Cl.
*H01L 23/40*   (2006.01)
*H01L 23/473*   (2006.01)
*H01L 25/07*   (2006.01)

(52) U.S. Cl.
CPC ........ *H01L 23/4006* (2013.01); *H01L 23/473* (2013.01); *H01L 25/072* (2013.01);
(Continued)

(58) Field of Classification Search
CPC ..... H01L 23/40–4093; H01L 24/71–72; H01L 2023/4031–4087
See application file for complete search history.

(56) References Cited

U.S. PATENT DOCUMENTS 6,087,682 A     7/2000   Ando
2010/0284155 A1*  11/2010   Stolze ............... H01L 23/4006
                                                   361/728
(Continued)

FOREIGN PATENT DOCUMENTS

DE    102014106570 A1   11/2015
DE    102017117667 A1    7/2019
JP    2014-013884 A      1/2014

OTHER PUBLICATIONS

DE 10 2022 129 449.8, Search Report dated May 2, 2023, 5 pages—German, 5 pages—English, 5 pages.

*Primary Examiner* — Laura M Menz
*Assistant Examiner* — Candice Chan
(74) *Attorney, Agent, or Firm* — Andrew F. Young; Nolte Lackenbach Siegel

(57) ABSTRACT

A power semiconductor module has a base plate with a housing and a switching device. The switching device has a substrate and a connecting device with a first and a second main face. A group of power semiconductor components is arranged on a conductor track of the substrate, and has a group midpoint. A pressure device is formed on the substrate in the normal direction to exert pressure, which pressure device has a pressure body and a pressure inducing body, wherein a pressure element is arranged protruding from the pressure body, wherein the pressure element presses onto a pressure section of the second main face of the connecting device, and wherein the pressure inducing body has a pressure transmission section with a pressure transmission point.

13 Claims, 4 Drawing Sheets

(52) U.S. Cl.
CPC ............. *H01L 2023/4081* (2013.01); *H01L 2023/4087* (2013.01)

(56) References Cited

U.S. PATENT DOCUMENTS

2012/0193076 A1* 8/2012 Sakamoto ............. H01L 23/427
165/104.21
2021/0020539 A1* 1/2021 Otremba ............. H01L 21/4871

* cited by examiner

POWER SEMICONDUCTOR MODULE HAVING A PRESSURE DEVICE ACTING ON A SWITCHING DEVICE

CROSS REFERENCE TO RELATED APPLICATIONS

This application relates to and claims priority to DE 10 2022 129 449.8 filed Nov. 8, 2023, the entire contents of which are incorporated herein fully by reference.

FIGURE SELECTED FOR PUBLICATION

FIG. 2.

BACKGROUND OF THE INVENTION

Field of the Invention

The invention describes a power semiconductor module having abase plate, on which a housing and a switching device enclosed by the latter are arranged, wherein the switching device has a substrate and a connecting device. A component group of power semiconductor components, which preferably form a power switch, is arranged on a conductor track of this substrate, this component group having a group midpoint. Above the substrate in the normal direction of the latter, there is a pressure device which has a pressure body and a pressure inducing body, a pressure element being arranged protruding from the pressure body. The pressure element presses onto a pressure section of the second main face of the connecting device.

Description of the Related Art

From the related art, for example as disclosed in DE 10 2014 106 570 A1, a power semiconductor module and an arrangement having the latter are known. The power semiconductor module is configured with a housing, a switching device having a substrate connected to the housing, a power semiconductor component arranged thereon, a connecting device, load terminal devices and a pressure device configured to be movable against the housing. The substrate has a first central through-opening and conductor tracks electrically insulated from one another, a power semiconductor component being arranged on one conductor track. The connecting device has a first and a second main face and is configured with an electrically conductive sheet. The pressure device furthermore has a pressure body with a second through-opening, which is flush with the first and has a first recess from which the pressure element is arranged protruding, the pressure element pressing onto a section of the second main face of the connecting device and this section being arranged inside the area of the power semiconductor component in a projection along the normal direction of the substrate. The first and second through-openings are configured to receive a fastening means which fastens the power semiconductor module with a force-fit in the arrangement on a cooling device. A disadvantage with this is that the substrate has a central through-opening, which conflicts with economical production of the substrate.

DE 10 2017 117 667 A1 discloses a power semiconductor module which is configured with a base plate, on which a housing and a switching device enclosed by the latter are arranged, wherein the switching device has a substrate and a connecting device that has a first and a second main face, wherein a power semiconductor component is arranged on a conductor track of this substrate, and having a pressure device which is configured to be movable in the normal direction of the substrate and has a pressure body and a pressure inducing body, wherein a pressure element is arranged protruding from the pressure body, wherein the pressure element presses onto a section of the second main face of the connecting device and this section is arranged inside an area of the power semiconductor component in a projection along the normal direction of the substrate, and wherein the pressure inducing body is braced against the base plate by means of at least two fastening means, which engage in abutments of the base plate, and wherein the abutments, or more precisely the respective center thereof, and the geometrical midpoint of the substrate are arranged on a straight line.

ASPECTS AND OBJECTS OF THE INVENTION

At least one of the objects of the present invention is to provide an improvement over the related art.

According to one alternative and adaptive aspect of the invention a power semiconductor module is proposed, having a base plate on which a housing and a switching device enclosed by the latter are arranged, wherein the switching device has a substrate and a connecting device that has a first and a second main face, wherein a component group of power semiconductor components is arranged on a conductor track of this substrate, this component group having a group midpoint, and having a pressure device formed on the substrate in the normal direction of the latter in order to exert pressure, which pressure device has a pressure body and a pressure inducing body, wherein a pressure element is arranged protruding from the pressure body, wherein the pressure element presses onto a pressure section of the second main face of the connecting device, and wherein the pressure inducing body has a pressure transmission section with a pressure transmission point, which is approximately flush with the group midpoint in the normal direction, wherein a respective fastening section of the pressure inducing body in order to create pressure is braced against the base plate by means of at least two fastening means, which cooperate respectively with an assigned abutment of the base plate.

One alternative object of the invention is to provide a power semiconductor module having a base plate and having at least one switching device and a pressure device acting on the latter, wherein the pressure induction is improved.

This object is achieved according to the invention by a power semiconductor module having a base plate, on which a housing and a switching device enclosed by the latter are arranged, wherein the switching device has a substrate and a connecting device that has a first and a second main face, wherein a component group of in particular at least three power semiconductor components is arranged on a conductor track of this substrate, this component group having a group midpoint, and having a pressure device formed on the substrate in the normal direction of the latter in order to exert pressure, which pressure device has a pressure body and a pressure inducing body, wherein a pressure element is arranged protruding from the pressure body, wherein the pressure element presses onto a pressure section of the second main face of the connecting device, and wherein the pressure inducing body has a pressure transmission section with a pressure transmission point, which is approximately flush with the group midpoint in the normal direction, wherein a respective fastening section of the pressure inducing body in order to create pressure is braced against the base plate by means of at least two fastening means, which cooperate respectively with an assigned abutment of the base plate.

Preferably, the component group of power semiconductor components forms a power switch or at least a partial power switch. For example, two power switches arranged in series form a half-bridge circuit. In this case, all the power semiconductor components of a power switch are preferably driven simultaneously.

Here and in what follows, the term "pressure transmission point" is intended to mean the midpoint of a pressure transmission area. The pressure transmission point is therefore the mathematical idealisation of this pressure transmission area.

It may be advantageous for the base plate to be configured as part of a cooling device, in particular a liquid cooling device.

It is particularly advantageous for a multiplicity of substrates, preferably all the substrates, to be arranged in series. In a first advantageous configuration, each substrate is assigned its own pressure inducing body. In a second advantageous configuration, a multiplicity, preferably all, of the substrates are assigned a common pressure inducing body. In this case, fastening sections arranged between two neighboring substrates may coincide with a common fastening section, and respectively assigned abutments preferably coincide with a common abutment.

It may be advantageous for the group midpoint to be determined from the location of the power semiconductor component of a component group as the geometrical midpoint or as the force midpoint of the power semiconductor components, preferably their component centers.

The force midpoint is determined as the point from which the maximum value of the product of distance and power semiconductor component area at this point is minimum and the maximum value of this product is minimum. This determination is simplified for the case in which all the power semiconductor components are configured identically at the same point, from which the maximum distance of a power semiconductor component is minimum and the minimum distance is maximum. In other words, all the power semiconductor components are as equally far apart as possible in this simplification.

It may alternatively be advantageous for the location of the power semiconductor components of a component group to be selected to be equidistant or weightedly equidistant from a predetermined midpoint, the weighting preferably being carried out proportionally to the area of the respective power semiconductor component.

It may be preferred for the respective substrate to be configured rectangularly and for the assigned abutments to be arranged next to mutually opposite sides, and preferably arranged with respective side midpoints of these sides on a straight line.

It may be advantageous for the pressure inducing body to be configured as a two-dimensional resilient shaped metal body. In this case, the shaped metal body may have a connecting section between two fastening sections. Furthermore, the pressure transmission section may be configured as a part of the connecting section or as a multiplicity of pressure transmission sections, which jut laterally out from the connecting section.

It is particularly preferred for the pressure force exerted by the respective pressure transmission section to be dependent on at least one of the following parameters: number of power semiconductor components of the component group, type of power semiconductor components of the component group, summed current-carrying capacity of all the power semiconductor components of the component group.

In principle, it may be advantageous for a midpoint spacing from the group midpoint to the pressure transmission point to be less than 0.5 times, preferably less than 0.3 times and particularly preferably less than 0.15 times the distance of the group midpoint from the component center of that power semiconductor component of the component group which lies furthest away therefrom.

In principle, it may also be advantageous for the respective distance of the component centers of all the power semiconductor components of a component group from the group midpoint to deviate by less than 0.3 times, preferably less than 0.2 times and particularly preferably less than 0.1 times from the average (arithmetic mean) distance. In other words, the component centers lie on a circle around the group midpoint and radially deviate only slightly from this location, within the framework indicated.

It is particularly advantageous for the pressure transmission point to be arranged next to all the power semiconductor components of a component group in the normal direction, that is to say for the pressure transmission point not to lie inside the component area of an arbitrary power semiconductor component of the component group.

It may in this case be advantageous for a distance of the component center of each power semiconductor component from the assigned pressure transmission point to be at least 2 times, preferably 3 times the longer edge length of this power semiconductor component.

It may also be advantageous for a pressure section of a multiplicity of pressure sections of the connecting device to be respectively arranged in a projection along the normal direction of the substrate inside an area of a respectively assigned power semiconductor component, that is to say each power semiconductor component is assigned at least one pressure element, and preferably precisely one pressure element.

It is particularly advantageous for the connecting device to be configured as a sheet stack having at least one electrically conductive sheet and at least one electrically insulating sheet.

It is also advantageous for the pressure body to consist of a high-temperature resistant thermoplastic, in particular polyphenylene sulfide, and for the pressure element to consist of a silicone rubber, in particular liquid silicone.

Of course, unless it is ruled out explicitly or per se, or conflicts with the concept of the invention, the features or groups of features respectively mentioned in the singular, in particular the power semiconductor component, may also be present in the plural in the power semiconductor module according to the invention.

It is to be understood that the various configurations of the invention may be implemented individually or in any desired combinations in order to achieve improvements. In particular, the features mentioned and explained above and below may be used not only in the combinations specified but also in other combinations or separately, without departing from the scope of the present invention.

Further explanations of the invention, advantageous details and features may be found in the following description of the exemplary embodiments of the invention, which are schematically represented in the drawings or respective parts thereof.

The above and other aspects, features, objects, and advantages of the present invention will become apparent from the following description read in conjunction with the accompanying drawings for exemplary but nonlimiting embodiments, in which like reference numerals designate the same elements.

DETAILED DESCRIPTION OF THE PREFERRED EMBODIMENTS

Figure 1:
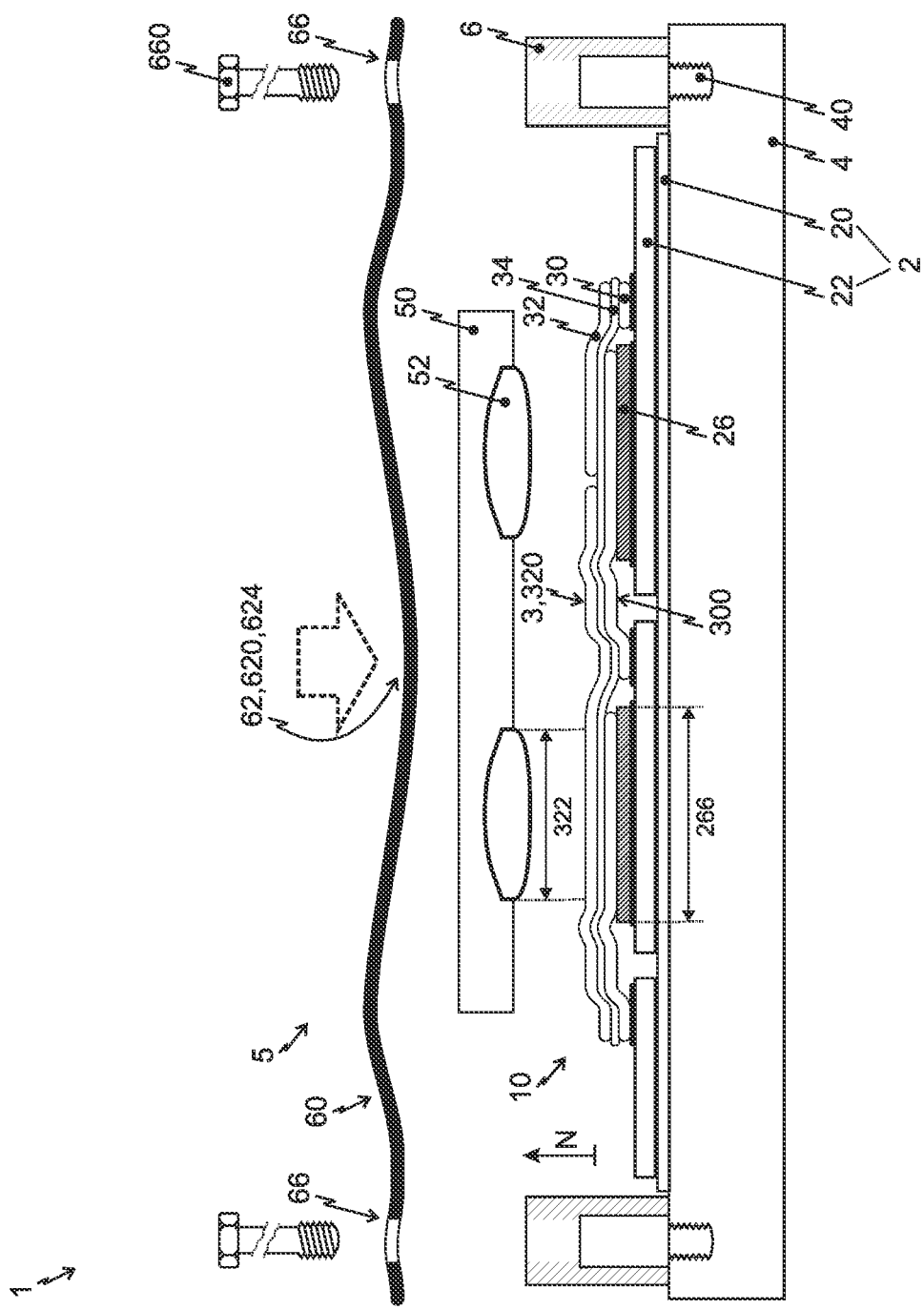
FIG. 1 shows a first configuration of a power semiconductor module according to the invention in a side view.

Reference will now be made in detail to embodiments of the invention. Wherever possible, same or similar reference numerals are used in the drawings and the description to refer to the same or like parts or steps. The drawings are in simplified form and are not to precise scale. The word 'couple' or 'bond' or and similar terms do not necessarily denote direct and immediate connections, but also include connections through intermediate elements or devices. For purposes of convenience and clarity only, directional (up/down etc.) or motional (forward/back, etc.) terms may be used with respect to the drawings. These and similar directional terms should not be construed to limit the scope in any manner. It will also be understood that other embodiments may be utilized without departing from the scope of the present invention, and that the detailed description is not to be taken in a limiting sense, and that elements may be differently positioned, or otherwise noted as in the appended claims without requirements of the written description being required thereto.

FIG. 1 shows a first configuration of a power semiconductor module 1 according to the invention, having a base plate 4 and having a switching device 10 arranged on the base plate 4, in a lateral sectional view. Represented as part of the switching device 10 is a substrate 2, essentially configured as is customary according to the prior art, having an insulating body 20 and, arranged thereon, conductor tracks 22 respectively insulated electrically from one another, which during operation have different potentials, in particular load potentials, but also auxiliary, in particular switching and measuring potentials, of the switching device 10. Here, three conductor tracks 22 with load potentials, such as are typical of a half-bridge topology, are represented specifically and by way of example.

A power semiconductor component 26, which is configured here as a MOS-FET as is customary according to the prior art, is respectively arranged on two conductor tracks 22. The power semiconductor components 26 are electrically conductively connected to the conductor tracks 22 as is customary according to the prior art, preferably by means of a sintered connection.

The internal connections of the switching device 10 are formed by means of a connecting device 3 from a sheet composite or sheet stack which is customary according to the prior art, consisting of a first electrically conductive sheet 30, an electrically insulating sheet 34 and a second electrically conductive sheet 32. This connecting device 3 connects in particular the respective power semiconductor component 26, or more precisely its contact faces on the side facing away from the substrate 2, to conductor tracks 22 of the substrate 2. In a preferred configuration, conductor track sections of the connecting device 3 are respectively bonded materially to assigned contact faces of the power semiconductor components 260 by means of a sintered connection. Of course, connections between power semiconductor components 260 and between conductor tracks 22 of the substrate 2 may also be formed in the same way and simultaneously. The surface of the first conductive sheet 30 facing toward the substrate 2 in this case forms a first main face 300, while the opposite surface of the second conductive sheet 32 forms a second main face 320.

For the external electrical connection, the power semiconductor module 1 (not explicitly represented here) has a load and auxiliary terminal elements.

The power semiconductor module 1 furthermore has a housing 6, which is connected to the substrate 2 by an adhesive bond and may be configured in one or more parts, in which case one part of the housing may form a frame which is covered by another part. An overall frame-like configuration of the housing 6 is represented in FIG. 1 as well as in FIG. 5. The housing 6 is arranged on the base plate 4 and encloses the switching device 10, as well as a pressure device 5 that is movable in the normal direction N of the substrate, which is configured to exert pressure on the switching device 10 and therefore to press the switching device 10 onto the base plate 4.

The pressure device 5 has a pressure body 50 and a multiplicity of pressure elements 52, two of these being represented. The pressure body 50 is configured particularly rigidly in order to be able to forward the pressure induced on it homogeneously onto the pressure elements 52. For this purpose, and against the background of the thermal loading during operation of the power semiconductor module 1, the pressure body 50 consists of a high-temperature stable thermoplastic, in particular polyphenylene sulfide. The pressure elements 52 must be able to exert a substantially constant pressure during operation, and in particular at different temperatures. For this purpose, the pressure elements 52 consist of a silicone rubber, in particular so-called liquid silicone. In principle, all variants of the pressure device 5 such as are known from the prior art may be envisaged here.

The pressure device 5 furthermore has a pressure inducing body 60, which is configured as a two-dimensional resilient shaped metal body. This pressure inducing body 60 is braced against the base plate 4 by means of two fastening means 660, which engage in abutments 40 of the base plate 4, and presses centrally at the pressure induction point 624 onto the pressure body 60. For this purpose, in this configuration but not necessarily, the pressure inducing body 60 bears at its two fastening sections 660 onto the housing 6. Fastening means 660 configured as a screw respectively project through the respective fastening section 660, as well as through the housing 6. These screws engage with recesses of the base plate 4, which are provided with an internal screw thread, these recesses forming the abutments 40.

By the screwing of the fastening elements 660 to the base plate 4, the pressure inducing body 60 generates, with its pressure transmission section 620 as a part of the connecting section 62, a pressure centrally at the pressure induction point 624 onto the pressure body 50.

The pressure of the pressure inducing body 60 is induced by means of the pressure body 50 and the pressure elements 52 onto a section 322 of a second main face 320 of the connecting device 3. This induction respectively takes place onto the section 322 of the second main face 320 which is arranged inside the area 266 of the power semiconductor component 26 in a projection along the normal direction N of the substrate 2. The pressure is therefore forwarded, so that the substrate 2 is pressed particularly effectively onto the base plate 4 at the positions of the power semiconductor components 260. In this way, transmission of heat takes place particularly effectively from the respective power semiconductor component 260 onto the base plate 4, which is used for cooling and further heat dissipation.

Figure 2:
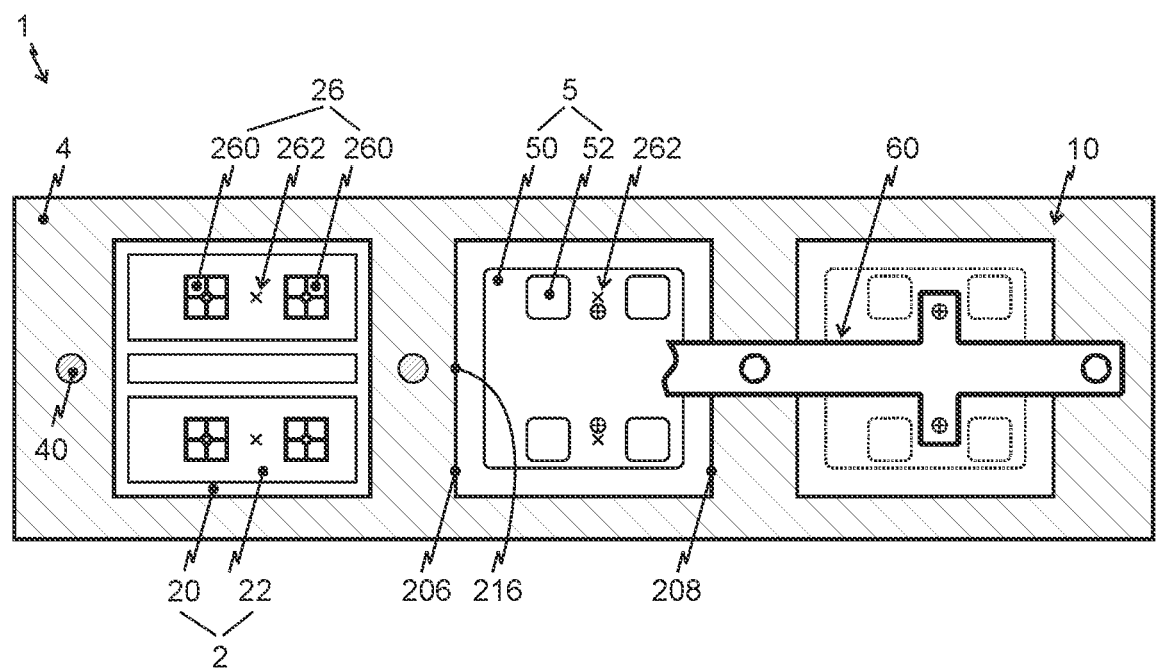
FIGS. 2 and 3 show various features of a second configuration of a power semiconductor module according to the invention in a plan view.
Figure 3:
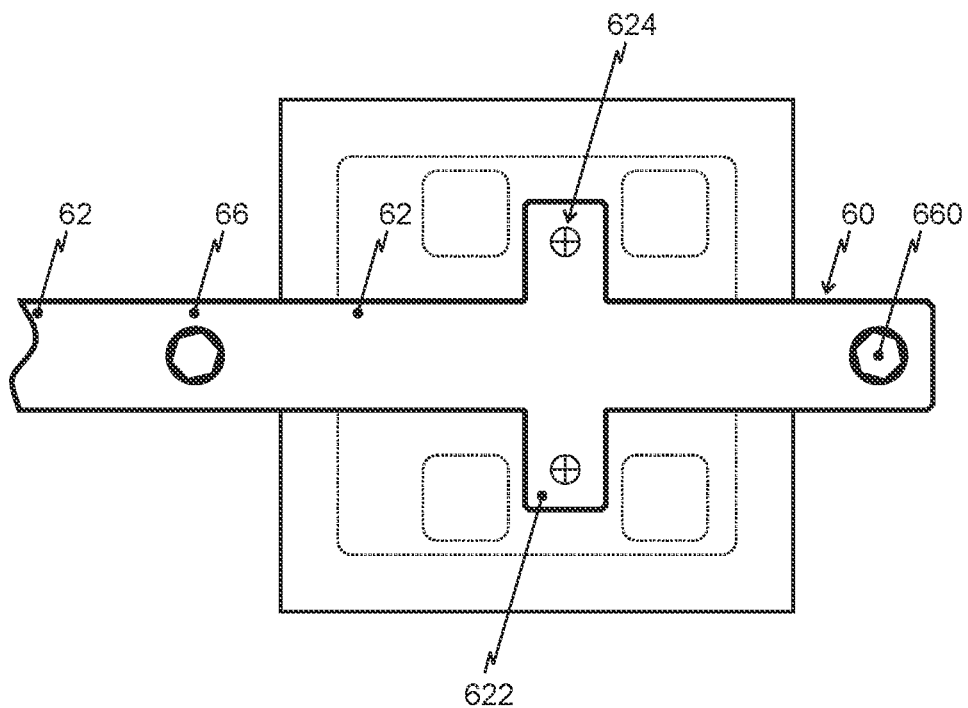

FIGS. 2 and 3 show various features of a second configuration of a power semiconductor module 1 according to the invention in a plan view, without the housing and the connection devices being explicitly represented. A base plate 4 of a power semiconductor module 1 is represented, having three switching devices 10 arranged in series, which in turn consist respectively of a rectangularly configured substrate 2, in each case configured as described with reference to FIG. 1. The connecting device (not explicitly represented) is also configured as described with reference to FIG. 1. FIG. 3 is an enlarged representation of the right-hand part of FIG. 2, but without the base plate 4.

Of the first, left-hand switching device 10, the substrate 2 with three conductor tracks 22 is represented. On two of the conductor tracks 22, two power semiconductor components 260 are respectively arranged by way of example. The two power semiconductor components 260 per conductor track 22 form a component group 26 and represent a power switch, here as part of a half-bridge circuit. Each component group 26 has a group midpoint 262. In this very simple configuration, the geometrical midpoint coincides with the force midpoint.

Of the second, central switching device 10, the pressure body 50 of the pressure device 5 respectively with a pressure element 52 is represented. The respective pressure element 52 is flush in the normal direction N of the substrate 2 with the assigned power semiconductor component 260. The normal direction projects out of the plane of the drawing.

Figure 5:
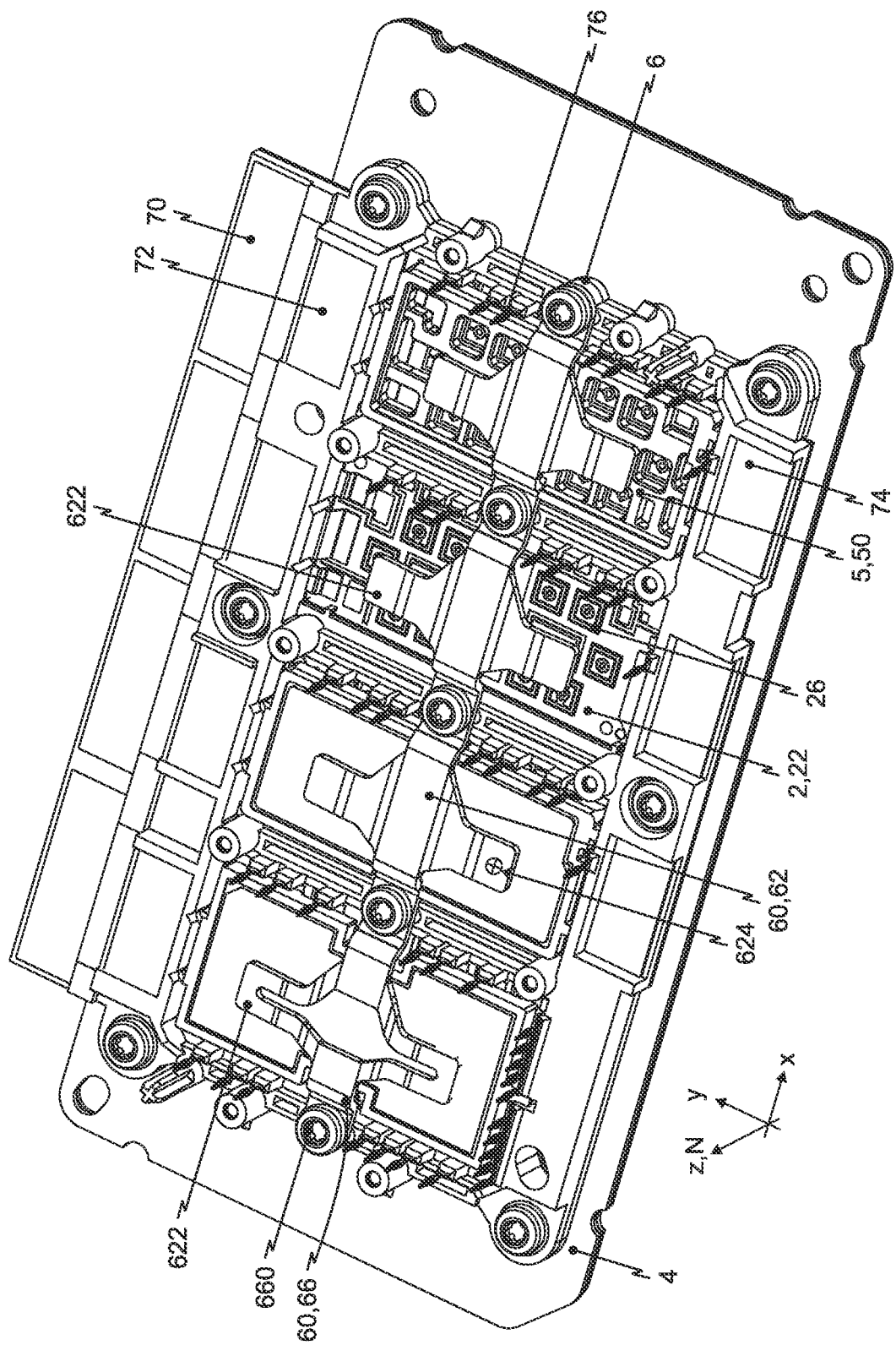
FIG. 5 shows features of a third configuration, represented in detail, of a power semiconductor module according to the invention in a three-dimensional view.

Of the third, right-hand switching device 10, the pressure inducing body 60 is represented, which is configured as a two-dimensional resilient shaped metal body, cf. also FIG. 5. This pressure inducing body 60 is only partially represented here for reasons of clarity, although it extends over all three switching devices 10 and has a multiplicity of fastening sections 66, which engage in abutments of the base plate by means of screws 660, in a similar way to FIG. 1. The fastening sections 66, like the assigned abutments, are arranged next to mutually opposite sides 206, 208 of the rectangular substrate 2 as seen in the normal direction N of the substrates 2 and lie with respective side midpoints 216 of these sides 206, 208 on a straight line.

A connecting section 62 is respectively arranged between two fastening sections 66. Two pressure transmission sections 622 which are configured as a part of the two-dimensional resilient shaped metal body, and therefore integrally with its other sections, jut perpendicularly out from this fastening section 62. Each pressure transmission section 622 has a pressure transmission point 624, which is also represented in the second switching device 10. This pressure transmission point 624 is intended according to the invention, and as seen in the normal direction N of the respective substrate 2, to be as close as possible to the group midpoint 262 of the component group 26 of power semiconductor components 260. However, likewise according to the invention, the pressure transmission point 624 and the group midpoint 262 are only approximately flush, and therefore do not coincide, or are not exactly flush with one another. In this exemplary embodiment, the distance of the pressure transmission point 624 from the group midpoint 262, and therefore the midpoint spacing 640, cf. FIG. 4, is less than 0.3 times the distance of the group midpoint 262 from the component center 264, in this exemplary embodiment of both power semiconductor components 260 of the component group 26.

Furthermore, the pressure transmission point 624 is arranged next to all the power semiconductor components 260 of a component group 26, as seen in the normal direction N. The pressure transmission point 624 is therefore arranged next to each of the power semiconductor components 260, of which there are two here, as seen in the normal direction N.

Figure 4:
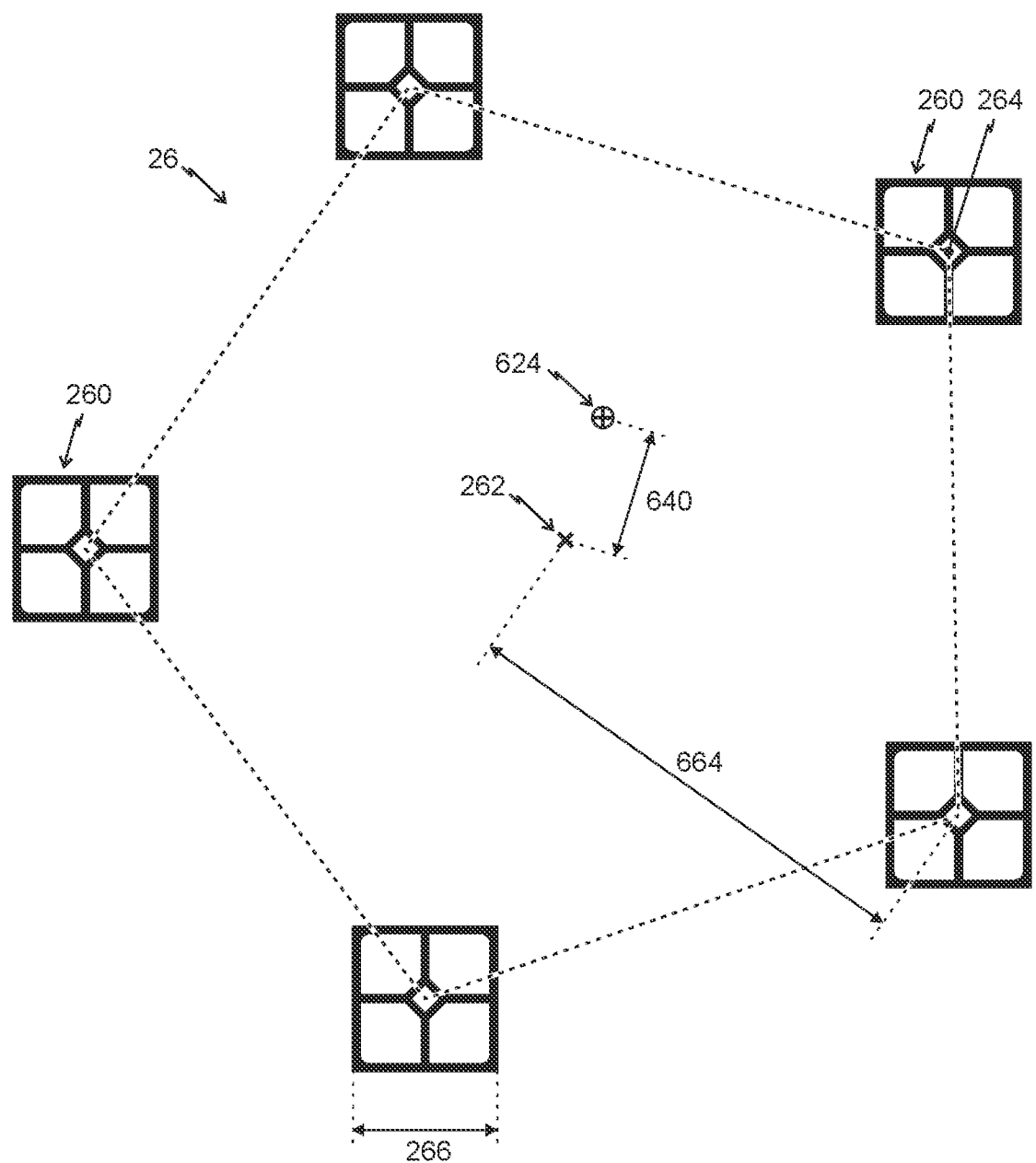
FIG. 4 shows, not to scale, a special configuration and a dimensioning of a power semiconductor module according to the invention in a plan view.

FIG. 4 shows, not to scale, a special configuration and a dimensioning of a component group 26 of the power semiconductor module according to the invention in a plan view. Here, five power semiconductor components 260 arranged in a pentagon are represented, the size of the power semiconductor components not being to scale with respect to the other dimensions. Rather, the power semiconductor components 260 are represented slightly too small here. FIG. 5, on the other hand, shows a configuration to scale. Nevertheless, in this case as well the pressure transmission point 624 is arranged next to all the power semiconductor components 260 of a component group 26 in the normal direction N.

All the power semiconductor components 260, more precisely their component centers 264, of the group 26 in this configuration lie on a circle around the group midpoint 262. According to the invention, the location on this imaginary circle may radially deviate limitedly. This does not mean that a deviation of the location of one of the power semiconductor components 260 may only take place radially, but that there is a restriction for this radial deviation.

Furthermore, represented is a pressure transmission point 624 and its midpoint spacing 640 from the group midpoint 262. This midpoint spacing 640 is in this case approximately 0.3 times the distance of the group midpoint 262 from the component center 264 of that power semiconductor component 260 of the component group 26 which lies furthest away therefrom.

FIG. 5 shows features of a third embodiment, represented in detail, of a power semiconductor module 1 according to the invention in a three-dimensional view. The power semiconductor module 1 has a base plate 4, which is configured here as a liquid cooling body. Arranged on this base plate 4, there is a frame-like housing 6 which laterally encloses four switching devices 10 arranged in series. As described above, these switching devices 10 respectively have a substrate 2 and a connecting device 3.

Arranged respectively on one conductor track 22 of the substrate 2 of all the first three switching devices 10 (counting from the top), there are five power semiconductor components 260, which form a component group 26 having a group midpoint 262 and a power switch. These power semiconductor components 260 are configured as power MOS-FETs. Each of these three switching devices 10 is moreover configured identically and respectively forms a half-bridge circuit. These three half-bridge circuits form a three-phase bridge circuit for the load power supply of an electric motor of a road vehicle driven thereby, preferably for transporting persons. The fourth switching device 10 is configured to perform other current conversion tasks.

The connecting device (not represented for reasons of clarity) of the first three switching devices 10 is configured essentially as described with reference to FIG. 1 as a sheet stack having at least one electrically conductive sheet and at least one electrically insulating sheet 30, 32, 34.

The power semiconductor module 1 furthermore has a pressure device 5, which has one pressure body 50 per switching device, this pressure body 50 having five pressure elements 52 per component group 26, one per power semiconductor component 260. These pressure elements 52 are arranged in the recesses represented and project in the direction of the connecting device and therefore in the direction of the assigned power semiconductor component 260, that is to say they correspondingly protrude therefrom. The pressure takes place as described with reference to FIG. 1 onto the respective pressure section 322 of the second main face 320 of the connecting device 3.

The pressure device 5 of the power semiconductor module 1 furthermore has a pressure inducing body 60 common to all the switching devices 10 and therefore also their substrates 2, which is configured as a two-dimensional resilient shaped metal body. The pressure inducing body 60 has a multiplicity of fastening sections 66, which are respectively connected to a connecting section 62. The fastening sections and the fastening means 660 arranged there, in this case screws, cooperate with abutments, here screw holes, of the base plate 4.

The fastening sections 66 arranged between two neighboring switching devices 10, or substrates 2, coincide with a common fastening section. The same applies for the respectively assigned abutments 40, which coincide with a common abutment.

In this configuration, the respective substrates 2, which are respectively part of a switching device 10, are configured rectangularly. The respective abutments are therefore arranged next to mutually opposite sides of the substrates 2.

The pressure inducing body 60 furthermore has two pressure transmission sections 622 per switching device 10, which jut laterally out from the connecting sections 62. These pressure transmission sections 622 are integral constituents of the pressure inducing body 60. All the sections, that is to say the fastening sections 66, the connecting sections 62 and the pressure transmission sections 622, therefore together form the one-piece pressure inducing body 60.

Each pressure transmission section 622 has a pressure transmission point 624. This pressure transmission point 624 is approximately flush as seen in the normal direction N, here the z direction, with the group midpoint 262 of the power semiconductor components 260.

The location of the pressure transmission point 624 with respect to the group midpoint 262, as seen in the normal direction N, on the one hand fulfils the condition that the midpoint spacing 640 of the group midpoint 262 from the pressure transmission point 624 is less than the aforementioned multiple of the distance of the group midpoint 262 from the component center 264 of that power semiconductor component 260 of the component group 26 which lies furthest away therefrom.

It likewise fulfils the condition that the respective distance 642 of the component centers 264 of all the power semiconductor components 260 of a component group 26 from the group midpoint 262 deviates by less than an aforementioned multiple from the average distance.

The pressure transmission point 624 is arranged next to all the power semiconductor components 260 of a component group 26 as seen in the normal direction N, so that the distance 644 of the component center 264 of each power semiconductor component 260 from the assigned pressure transmission point 624 is limited in relation to the longer edge length of this power semiconductor component 260.

The pressure force exerted by the respective pressure transmission section 622 at the pressure transmission point 624 is dependent on at least one of the following parameters: number of power semiconductor components 260 of the component group 26, type of power semiconductor components 260 of the component group 26, summed current-carrying capacity of all the power semiconductor components of the component group. For this reason, the connecting section 62 assigned to the fourth switching device 10, and the pressure transmission section 622 jutting out therefrom, are configured differently to the others. Specifically, the force induced via the respective pressure transmission sections 622 is less here than for the first three switching devices.

Furthermore, represented are load and auxiliary terminal elements which are customary according to the prior art. The DC voltage load terminal elements 70, 72 are configured two-dimensionally and are intended for welded connections. The same applies for the AC voltage terminal elements 74. The auxiliary terminal elements 76 are configured as press-pin terminal elements.

Also, the inventors intend that only those claims which use the specific and exact phrase "means for" are intended to be interpreted under 35 USC 112. The structure herein is noted and well supported in the entire disclosure. Moreover, no limitations from the specification are intended to be read into any claims, unless those limitations are expressly included in the claims.

Having described at least one of the preferred embodiments of the present invention with reference to the accompanying drawings, it will be apparent to those skills that the invention is not limited to those precise embodiments, and that various modifications and variations can be made in the presently disclosed system without departing from the scope or spirit of the invention. Thus, it is intended that the present disclosure covers modifications and variations of this disclosure provided they come within the scope of the appended claims and their equivalents.

What is claimed is:

1. A power semiconductor module, comprising:
a base plate, on which a housing and a switching device enclosed by the housing are arranged;
the switching device has a substrate and a connecting device that has a first main face and a second main face;
a component group having at least three power semiconductor components is arranged on a conductor track of the substrate;
the component group defining and having a group midpoint, and having a pressure device formed on the substrate in the normal direction (N) of the pressure device in order to exert pressure;
the pressure device has a pressure body and a pressure inducing body;
a pressure element is arranged protruding from the pressure body;
the pressure element presses onto a pressure section of the second main face of the connecting device;
the pressure inducing body has a pressure transmission section with a pressure transmission point, which is approximately flush with the group midpoint in the normal direction;
a respective fastening section of the pressure inducing body is braced against the base plate to create a pressure by means of at least two fastening means which cooperate respectively with an assigned abutment of the base plate;

wherein the group midpoint is determined from the location of the power semiconductor components of a component group as the geometrical midpoint or as the force midpoint of the power semiconductor components, wherein the pressure inducing body is configured as a two-dimensional resilient shaped metal body;

wherein the pressure transmission section is configured as a part of a connecting section or as a multiplicity of pressure transmission sections, which jut laterally out from the connecting section;

wherein a midpoint spacing from the group midpoint to the pressure transmission point is less than 0.5 times the distance of the group midpoint from the component center of that power semiconductor component of the component group which lies furthest away therefrom; and wherein the connecting device is configured as a sheet stack having at least one electrically conductive sheet and at least one electrically insulating sheet.

2. The power semiconductor module, according to claim 1, wherein:
the base plate is configured as part of a cooling device.

3. The power semiconductor module, according to claim 1, further comprising:
a plurality of substrates are arranged in series.

4. The power semiconductor module, according to claim 3, wherein:
each one of said plurality of substrates is has an assigned respective pressure inducing body.

5. The power semiconductor, module according to claim 3, wherein:
each of said plurality of substrates are assigned a common said pressure inducing body and respective said fastening sections arranged between two neighboring substrates coincide with a common fastening section; and
a plurality of respectively assigned abutments coincide with a common abutment.

6. The power semiconductor module, according to claim 5 wherein:
the pressure force exerted by the respective pressure transmission section is dependent on at least one of the following parameters:
a number of power semiconductor components of the component group, a type of power semiconductor components of the component group, and a summed current-carrying capacity of all the power semiconductor components of the component group.

7. The power semiconductor module, according to claim 3, wherein:
the respective substrate is configured rectangularly and the assigned abutments are arranged next to mutually opposite sides, and with respective side midpoints of these sides on a straight line.

8. The power semiconductor module, according to claim 1, wherein:
the location of the power semiconductor components of a component group is selected to be equidistant or weightedly equidistant from a predetermined group midpoint; and
the weighting preferably being carried out proportionally to the area of the respective power semiconductor component.

9. The power semiconductor module, according to claim 1, wherein:
the shaped metal body has the connecting section between two fastening sections.

10. The power semiconductor module, according to claim 1, wherein:
the respective distance of the component centers of all the power semiconductor components of a component group from the group midpoint deviates by less than 0.3 times from the average distance.

11. The power semiconductor module, according to claim 1, wherein:
the pressure transmission point is arranged next to all the power semiconductor components of a component group in the normal direction (N).

12. The power semiconductor module, according to claim 1, wherein:
a pressure section of a multiplicity of pressure sections of the connecting device is respectively arranged in a projection along the normal direction (N) of the substrate inside an area of a respectively assigned power semiconductor component.

13. The power semiconductor module, according to claim 1, wherein:
the pressure body further comprises:
at least one of a high-temperature resistant thermoplastic and a polyphenylene sulfide; and
the pressure element consists of at least one of a silicone rubber and a liquid silicone.

* * * * *